United States Patent [19]
McGinley

[11] Patent Number: 4,870,380
[45] Date of Patent: Sep. 26, 1989

[54] MAGNET ARRANGEMENTS

[75] Inventor: John V. M. McGinley, London, England

[73] Assignee: Picker International, Ltd., Wembley, England

[21] Appl. No.: 312,628

[22] Filed: Feb. 17, 1989

[30] Foreign Application Priority Data

Feb. 26, 1988 [GB] United Kingdom ................ 8804567

[51] Int. Cl.[4] .............................................. H01F 7/00
[52] U.S. Cl. .................................... 335/296; 335/297; 324/318
[58] Field of Search ............... 335/296, 297, 298, 301, 335/304; 324/318, 319, 320

[56] References Cited

U.S. PATENT DOCUMENTS 4,217,568 8/1980 Chiba et al. ......................... 335/298
4,672,346 6/1987 Miyamoto et al. ............. 335/298 X
4,679,022 7/1987 Miyamoto et al. ................ 335/296

FOREIGN PATENT DOCUMENTS 2136209 6/1986 United Kingdom .

OTHER PUBLICATIONS

H. Zijlstra; "Permanent Magnet Systems for NMR Tomography", Philips Journal of Research, vol. 40, No. 5, (1985), pp. 259–288.

Primary Examiner—George Harris
Attorney, Agent, or Firm—Timothy B. Gurin

[57] ABSTRACT

A magnet arrangement for producing a magnet field in a gap (3) between a pair of pole pieces (1), e.g. to provide the main magnetic field for application to a subject for magnetic resonance imaging, wherein adjacent the pole pieces the magnet core 15 has sections 17 of restricted cross-sectional area which serve to improve the homogeneity of the field in the gap.

10 Claims, 2 Drawing Sheets

MAGNET ARRANGEMENTS

This invention relates to magnet arrangements.

More particularly the invention relates to magnet arrangements of the kind which produce a magnetic field in a gap between a pair of facing surfaces between which a flux return path is provided by way of a structure of ferromagnetic material extending between the surfaces.

It is sometimes desirable for the gap of such a magnet arrangement to be as accessible as possible, for example, where the magnet arrangement is intended for use in a magnetic resonance imaging apparatus to provide the static magnetic field in which an object to be imaged is required to be placed to define an equilibrium axis of magnetic alignment in the object. In such cases the ferromagnetic material structure is suitably arranged to be of generally 'C' shaped form so that the structure lies to one side only of the gap leaving the gap wholly accessible from other directions. Unfortunately, such a configuration tends to give rise to a non-uniform flux distribution across the gap, the magnetic field tending to be stronger at the side of the gap nearer the structure. As a consequence, for applications such as magnetic resonance imaging, where a field of high homogeneity is required, it has hitherto not always been practicable to use magnet arrangements as described above of 'C' shaped form. To obtain the required high degree of field homogeneity it has been necessary to use configurations giving reduced gap accessibility, e.g with two flux return paths respectively on opposite sides of the gap.

It is an object of the present invention to provide a magnet arrangement wherein this problem is overcome.

According to the invention there is provided a magnet arrangement comprising a source of magnetic flux and a structure of ferromagnetic material providing paths for magnetic flux produced by said source between a first surface of said structure and a second surface of said structure spaced from said first surface to produce a magnetic field across a gap between said surfaces, said structure including first and second aligned portions and a U-shaped further portion, said first and second portions extending respectively from said first and second surfaces away from said gap and being joined at their ends remote from said gap by said U-shaped portion of said structure, which U-shaped portion extends from and around said gap on one side thereof, said first and second portions at their ends adjoining said U-shaped portion each having an end section of reduced cross-sectional area which serves to improve the uniformity of the magnetic field in said gap.

Preferably said end sections of reduced cross-sectional area are provided at least partly by virtue of a rebate in each of said first and second portions at its end remote from said gap on the side from which said U-shaped portion extends.

In such an arrangement each of said first and second portions preferably has a further rebate at its end remote from said gap on the opposite side to that from which said U-shaped portion extends.

One magnet arrangement in accordance with the invention will now be described by way of example wih reference to the accompanying drawings in which.

Figure 1:
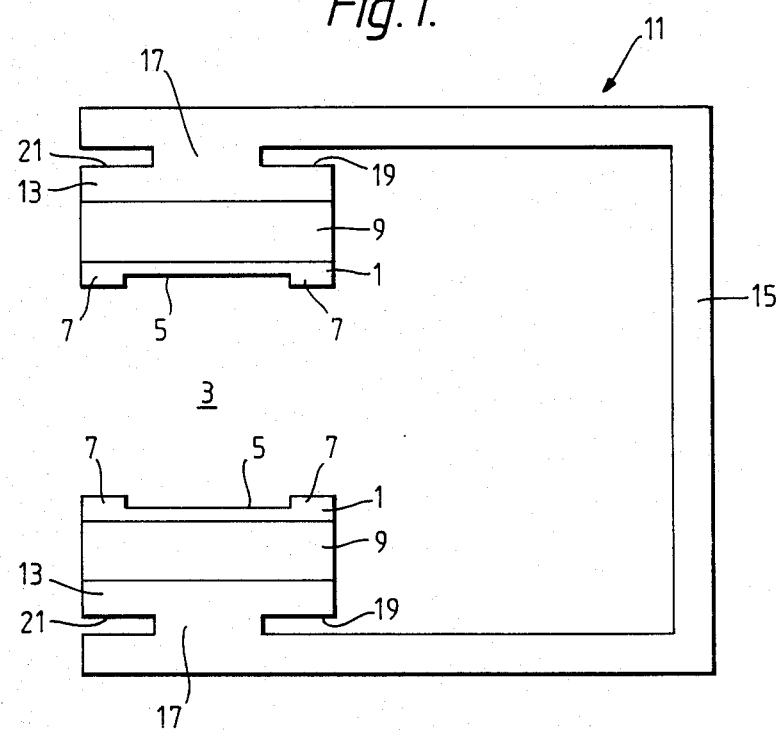
FIG. 1 is a schematic diagram of the arrangement.

Referring to FIG. 1, the magnet arrangement comprises a pair of pole pieces 1 of high permeability steel positioned on opposite sides of a gap 3 in which it is required to produce a uniform magnetic field, the gap 3 being defined by generally parallel facing surfaces 5 of the pole pieces 1 of the desired shape and area.

The surfaces 5 are typically of rectangular shape, but may be of any other desired shape, e.g. circular or oval. Furthermore, the surfaces 5 may be profiled in known manner to give fine control of the distribution of the field in the gap 3, as indicated by projections 7 at each side of the surfaces 5 in FIG. 1.

Abutting each pole piece 1 on its side remote from the gap 3 there is a permanent magnet 9, each magnet 9 being of the same cross-sectional shape and area as the pole pieces 1 and being in register with the adjacent pole piece 1.

At its side remote from the adjacent pole piece 1, each magnet 9 abuts a respective end of a generally 'C' shaped yoke 11 of ferromagnetic material.

The magnets 9 are magnetised in a direction perpendicular to the surfaces 5 of the pole pieces 1, thus producing a magnetic field between the surfaces 5 in a direction perpendicular to the surfaces 5, a return path for the flux being provided between the magnets 9 via the yoke 11.

The yoke 11 is shaped so as to provide a field in the gap 3 of high uniformity. To this end, the yoke comprises two aligned portions 13 each extending between a respective one of the magnets 9 and the free end of a respective one of the limbs of a U-shaped main portion 15 of the yoke 11, which thus joins the ends of the portions 13 remote from the magnets 9 and completes the return flux path around one side of the gap 3. Over the major part of its length each portion 13 is of the same cross-sectional shape and area as, and in register with, the face of the magnet 9 which it abuts. However, at its end remote from the associated magnet 9, each portion 13 has a short end section 17 which is of reduced cross-sectional area by virtue of the presence of rebates 19 and 21 in this end of each portion 13, one of the rebates 19 being at the side of the portion 13 from which the U-shaped portion 15 extends, and the other rebate 21 being on the opposite side.

Figure 2:
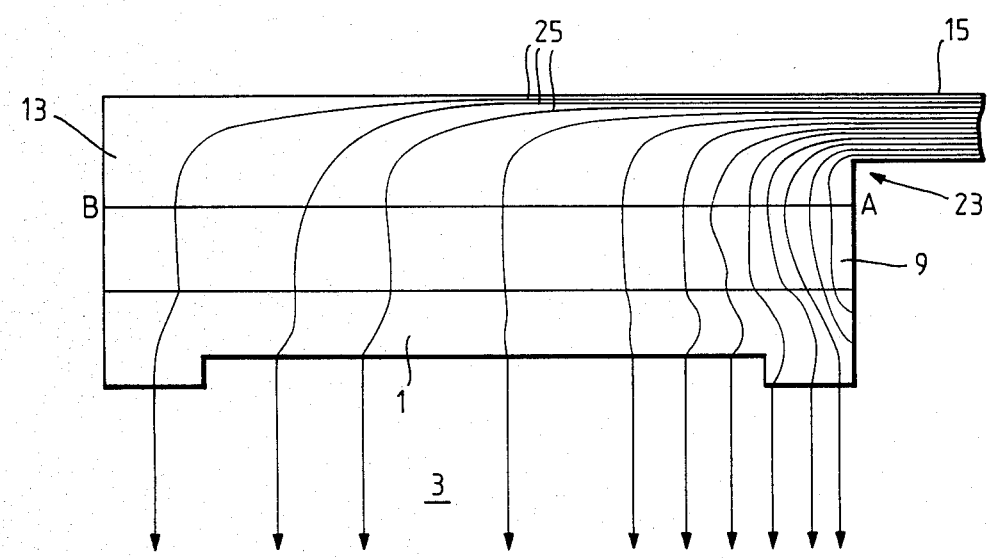
FIG. 2 is a diagram illustrating the flux flow pattern in part of a prior art magnet arrangement.
Figure 3:
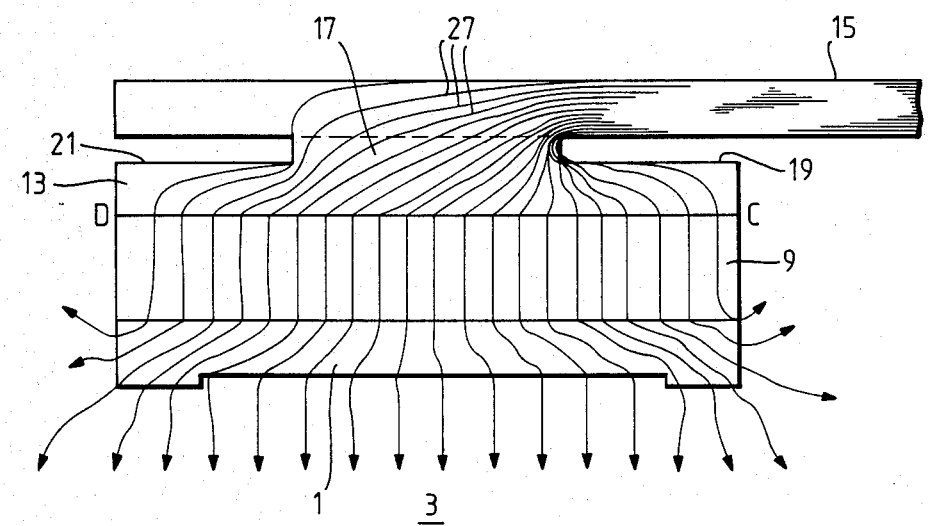
FIG. 3 is a diagram illustrating the flux flow pattern in part of the arrangement of FIG. 1.

The effect of the rebates 19 and 21 on field uniformity in the gap 3 is illustrated in FIGS. 2 and 3.

As illustrated in FIG. 2, in the absence of the rebates 19, 21, i.e. in the absence of the end sections 17 (as in comparable prior art magnet arrangements), since magnetic flux tends to flow along paths of least resistance, flux favours paths around the inside corners 23 between portions 13 and 15 of the yoke 11, i.e. the corners nearer the flux return path around the gap 3 provided by yoke portion 15. As a result, at the ends of the yoke portions 13 adjacent magnets 9, i.e. along line AB in FIG. 2, flux density is at a maximum at end A of the line AB and decreases along the line in a direction towards B, as indicated by flux lines 25 in FIG. 2. This unevenness in flux distribution remains through the magnets 9 and pole pieces 1 and into the gap 3 so that the field in gap 3 has a gradient in a direction parallel to line AB.

Referring to FIG. 3, in the magnet arrangement of FIG. 1 the presence of rebates 19 eliminates the flux paths of least resistance, as at corner 23 of FIG. 2, by increasing the lengths of the shortest flux paths available in the structure. The flux paths now all extend via the sections 17 of the portions 13 of the yoke 11 of reduced cross-sectional area, as indicated by lines 27 in FIG. 3, and spread out through the remainder of portions 13 to be of substantially uniform distribution at the ends of portions 13 adjacent magnets 9, i.e. along line CD of FIG. 3, with consequent improvement of field homogeneity in the gap 3.

The rebates 21 serve to further improve homogeneity by reducing any tendency for field strength to drop off at the outside of the gap 3, i.e. at the end D of line CD.

It will be appreciated that of the two rebates 19 and 21 the inner rebate 19 is of greater importance and will normally be of greater length than rebate 21. In practice the optimum lengths and widths and the rebates 19, 21 are best found by trial and error.

Figure 4:
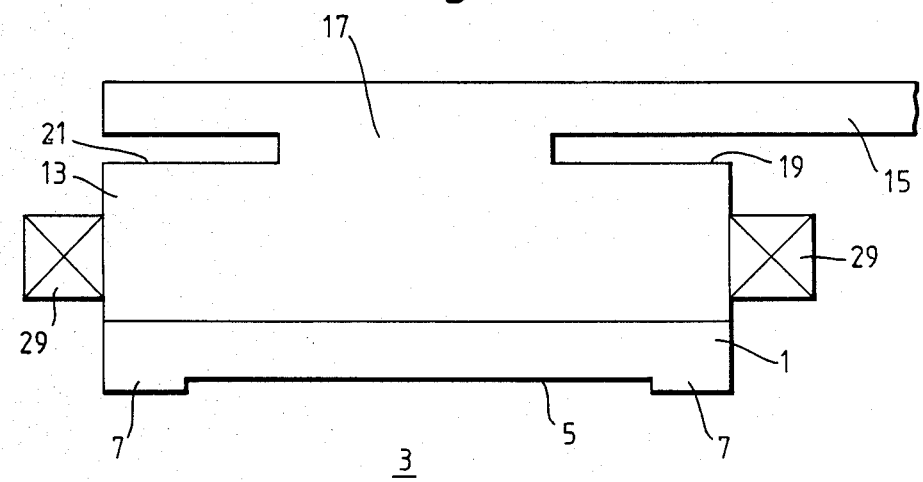
FIG. 4 is a diagram illustrating a modification of the magnet arrangement of FIG. 1.

It will be understood that whilst in the magnet arrangement described above by way of example with reference to FIGS. 1 and 2, the flux source is in the form of two permanent magnets 9 adjacent the pole pieces 1, in other arrangements magnets in different positions may be used, or only one or more than two magnets may be used. Furthermore, electric coils instead of permanent magnets may be used as flux sources, e.g. coils 29 positioned around portions 13 of the yoke 11 of FIG. 1, as illustrated in FIG. 4, the portions 13 now extending between pole pieces 1 and yoke portion 15.

One particular application of a magnet arrangement according to the present invention is in a magnetic resonance imaging apparatus for providing the uniform static magnetic field applied to an object to be imaged in such an apparatus to establish an equilibrium axis of magnetic alignment in the object. One such imaging apparatus using a prior art magnet arrangement is described in U.S. Pat. No. 3,443,122.

I claim:

1. A magnet arrangement comprising a source of magnetic flux and a structure of ferromagnetic material providing paths for magnetic flux produced by said source between a first surface of said structure and a second surface of said structure spaced from said first surface to produce a magnetic field across a gap between said surfaces, said structure including first and second aligned portions and a U-shaped further portion, said first and second portions extending respectively from said first and second surfaces away from said gap and being joined at their ends remote from said gap by said U-shaped portion of said structure, which U-shaped portion extends from and around said gap on one side thereof, said first and second portions at their ends adjoining said U-shaped portion each having an end section of reduced cross-sectional area which serves to improve the uniformity of the magnetic field in said gap.

2. A magnet arrangement according to claim 1 wherein said end section of reduced cross-sectional area are provided at least partly by virtue of a rebate in each of said first and second portions at its end remote from said gap on the side from which said U-shaped portion extends.

3. A magnet arrangement according to claim 2 wherein each of said first and second portions has a further rebate at its end remote from said gap on the opposite side to that from which said U-shaped portion extends.

4. A magnet arrangement according to claim 1 wherein, except over said end section, each of said first and second portions has a uniform cross-sectional area of the same shape and area as, and in register with, the associated one of said first and second surfaces.

5. A magnet arrangement according to claim 1 wherein each said end section is of uniform cross-sectional area over its length.

6. A magnet arrangement according to claim 1 wherein said pole pieces and said first and second portions are of rectangular cross-section.

7. A magnet arrangement according to claim 1 wherein said flux source comprises at least one permanent magnet incorporated in said structure of magnet material.

8. A magnet arrangement according to claim 7 wherein said flux source comprises two permanent magnets each positioned in a respective one of said first and second portions at an intermediate position between the associated one of said first and second surfaces and the said end section of that portion.

9. A magnet arrangement according to claim 1 wherein said flux source comprises at least one electric coil surrounding a part of said structure.

10. A magnet arrangement according to claim 9 wherein said flux source comprises two coils each surrounding an intermediate part of a respective one of said first and second portions.

* * * * *